(12) United States Patent
Karapatis

(10) Patent No.: US 8,992,784 B2
(45) Date of Patent: Mar. 31, 2015

(54) METHOD FOR MAKING A REINFORCED SILICON MICROMECHANICAL PART

(75) Inventor: Nakis Karapatis, Premier (CH)

(73) Assignee: Montres Breguet SA, L'Abbaye (CH)

( * ) Notice: Subject to any disclaimer, the term of this patent is extended or adjusted under 35 U.S.C. 154(b) by 92 days.

(21) Appl. No.: 13/386,049

(22) PCT Filed: Jul. 20, 2010

(86) PCT No.: PCT/EP2010/060497
§ 371 (c)(1),
(2), (4) Date: Feb. 29, 2012

(87) PCT Pub. No.: WO2011/009869
PCT Pub. Date: Jan. 27, 2011

(65) Prior Publication Data
US 2013/0029157 A1    Jan. 31, 2013

(30) Foreign Application Priority Data

Jul. 23, 2009   (EP) .................................... 09166269

(51) Int. Cl.
*B81C 1/00*   (2006.01)
(52) U.S. Cl.
CPC ....... *B81C 1/00682* (2013.01); *B81B 2201/035* (2013.01); *B81C 2201/0178* (2013.01); *B81C 1/00674* (2013.01)
USPC ......................................................... 216/2
(58) Field of Classification Search
CPC ...... G04B 17/066; G04B 13/02; G04B 1/145; B81B 2201/035; B81B 3/0075; B81C 1/00626; B81C 1/00682; B81C 1/00523; B81C 1/00666; B81C 1/00674
USPC ........... 216/2, 24; 257/98; 310/309; 365/158; 368/137, 175, 177, 327; 427/249.1, 427/249.9; 428/446; 438/712; 73/514.25
See application file for complete search history.

(56) References Cited

U.S. PATENT DOCUMENTS

| 5,425,989 | A | * | 6/1995 | Ogawa et al. ................. 428/333 |
| 5,628,917 | A | * | 5/1997 | MacDonald et al. ............. 216/2 |
| 2004/0018749 | A1 | | 1/2004 | Dorfman |
| 2008/0206539 | A1 | * | 8/2008 | Kobrin et al. ................. 428/220 |
| 2010/0214880 | A1 | * | 8/2010 | Rappo et al. .................. 368/127 |

FOREIGN PATENT DOCUMENTS

WO    2007 000271    1/2007

OTHER PUBLICATIONS

Juan, W.H., et al., "Controlling sidewall smoothness for micromachined Si mirrors and lenses," Jounrnal of Vacuum Science and Technology, vol. 14, No. 6, pp. 4080-4084, (Dec. 1, 1996).

(Continued)

*Primary Examiner* — Duy Deo
*Assistant Examiner* — Erin Bergner
(74) *Attorney, Agent, or Firm* — Oblon, McClelland, Maier & Neustadt, L.L.P.

(57) ABSTRACT

A method of fabricating a reinforced silicon micromechanical part includes: micro-machining the part, or a batch of parts in a silicon wafer; forming a silicon dioxide layer over the entire surface of the part, in one or plural operations, so as to obtain a thickness of silicon dioxide that is at least five times greater than the thickness of native silicon dioxide; and removing the silicon dioxide layer by etching.

4 Claims, 1 Drawing Sheet

(56) References Cited

OTHER PUBLICATIONS

Namazu, T., et al., "Evaluation of Size Effect on Mechanical Properties of Single Crystal Silicon by Nanoscale Bending Test Using AFM," Journal of Microelectromechanical Systems, vol. 9, No. 4, pp. 430-439, (Dec. 1, 2000).
Liu, Y., et al., "SOI-Based Capacitive Micromechanical Resonator with Submicron Gap-spacing," Proceedings of the 2009 $4^{th}$ IEEE International Conference on Nano/Micro Engineered and Molecular Systems, pp. 130-133, (Jan. 5-8, 2009).
Lee, K., et al., "Fabrication of ultralow-loss Si/SiO2 waveguides by roughness reduction," Optics Letters, vol. 26, No. 23, pp. 1888-1890, (Dec. 1, 2001).
"Semiconductors devices: physics and technology," John Wiley & Sons, pp. 341-355, (Janaury 1, 1985).
International Search Report Issued Nov. 2, 2010 in PCT/EP10/60497 Filed Jul. 20, 2010.

* cited by examiner

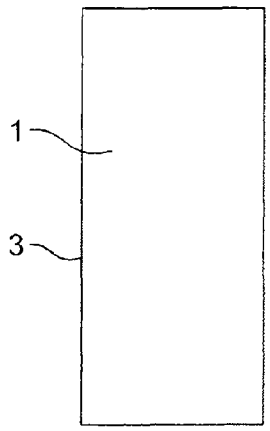
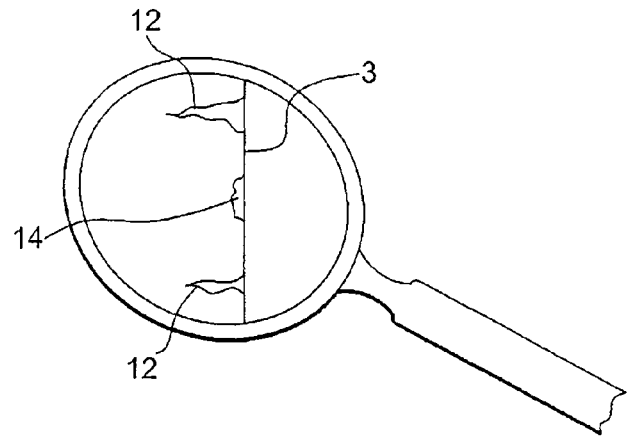
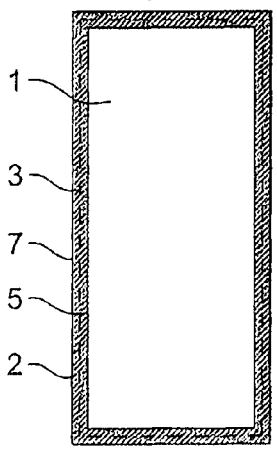
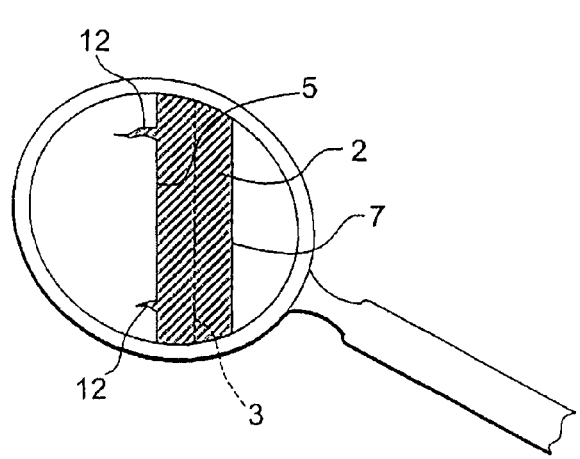
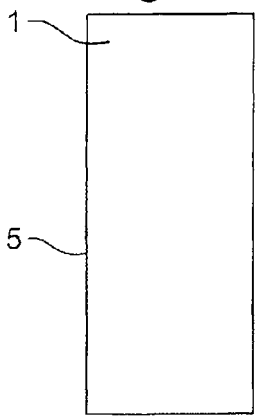
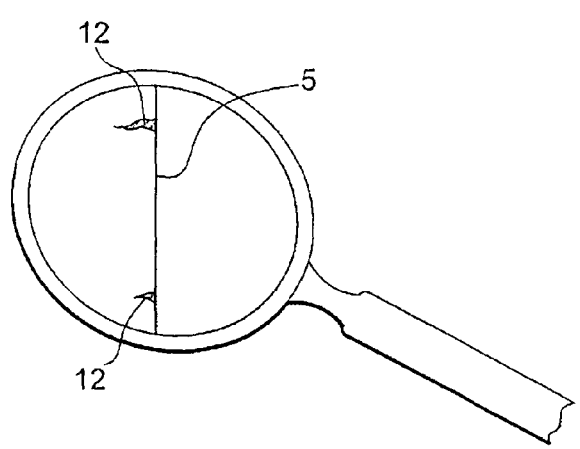

METHOD FOR MAKING A REINFORCED SILICON MICROMECHANICAL PART

FIELD OF THE INVENTION

The present invention concerns a method for producing reinforced micromechanical parts made of silicon. It concerns a method of making silicon micromechanical parts, which provides said parts with increased mechanical resistance and in particular shock resistance, and good tribological properties. The present invention more specifically concerns a method of this type for application to micromechanical parts arranged to be in friction contact with other parts, relative to which the micromechanical parts are in motion. These micromechanical parts may equally well be mobile parts, such as pivoting parts for example, or fixed parts, such as bearings for example. They may be, by way of non-limiting example, micromechanical parts for a mechanical timepiece movement.

BACKGROUND OF THE INVENTION

Silicon is a material that is increasingly used for the fabrication of mechanical parts and particularly micromechanical parts, whether they are "captive" parts, i.e. which remain connected to a substrate on which they have been machined, or "free" parts, such as parts forming part of the kinematic chain of a timepiece movement.

Compared to the metals or alloys conventionally used for fabricating micromechanical parts, such as toothed wheels, hinged parts, or springs, silicon has the advantage of having a density which is three to four times lower and thus of having very reduced inertia, and of being insensitive to magnetic fields. These advantages are particularly advantageous within the field of horology, both as regards isochronism and the duration of operation.

Silicon has, however, the justifiable reputation of being sensitive to shocks, which may be necessary during assembly, inevitable during operation, or accidental for example when the user knocks the wristwatch against something or drops it.

WO Patent document No. 2007/000271 proposes a method for improving the mechanical resistance of silicon micromechanical parts. According to this prior art document, once the parts have been micro-machined in a silicon wafer, the surface thereof is coated with a layer of silicon dioxide. This layer is formed by thermal oxidation of the surface of the part at a temperature of between 900° C. and 1200° C. The duration of the thermal oxidation process is determined so as to obtain a thickness of silicon dioxide which is at least five times greater than the thickness of native silicon dioxide.

One drawback of the method which has just been described is that the silicon dioxide substantially increases the friction coefficients of the parts obtained. To overcome this drawback, the aforementioned document proposes adding a coating of a different material onto the amorphous silicon dioxide. The different material must be selected for its tribological properties. This solution, which consists in adding an additional coating on top of the silicon dioxide layer, has the drawback of multiplying the layers of coating. Moreover, certain coatings do not adhere well to the silicon dioxide.

SUMMARY OF THE INVENTION

It is thus an object of the present invention to provide a method of fabricating silicon micromechanical parts, which provides said parts with mechanical resistance comparable to that of parts produced in accordance with the method of WO Patent No. 2007/000271, yet also provides said parts with tribological properties comparable to silicon parts which have not been coated with a silicon dioxide layer.

The invention therefore concerns a method of fabricating a reinforced silicon micromechanical part according to the annexed claim 1.

In a manner which, a priori, is surprising, experiments have shown that the step of the invention of removing the silicon dioxide layer has practically no effect on the mechanical properties of said part. In other words, the mechanical resistance of the parts produced according to the present invention is practically the same as that of parts produced according to the method of the aforementioned WO Patent document No 2007/000271. Moreover, the tribological properties of the parts produced according to the present invention are substantially better.

Although none of the hypotheses proposed hereinafter are limiting in nature, the explanation set out below may be given.

First of all, when the silicon dioxide layer is formed on the surface of the part, the dioxide does not simply exclusively coat the exterior of the part. It fills and seals cracks, gaps and other micro-apertures in the silicon. Since, from the chemical point of view, a silicon atom has more affinity for an oxygen atom than for another silicon atom, the silicon-dioxide joins should have greater adherence and the silicon dioxide forms a very efficient weld for flaws in the silicon.

When the silicon dioxide layer is removed, stripping occurs naturally from the exterior. Thus, the dioxide inside the micro-apertures in the silicon is the last to be etched. It is thus clear that, when the silicon dioxide layer has been removed, a certain number of dioxide veins or inserts should remain, filling the micro-apertures in the surface of the silicon part. The presence of these dioxide "welds" could be responsible for reinforcing the silicon, and thus for the greater mechanical resistance of the fabricated parts.

According to an advantageous variant of the method of the present invention, the silicon dioxide layer is formed by thermal oxidation of the surface of the part at a temperature of between 900° C. and 1200° C. It will be clear that according to this variant, the reaction producing the dioxide consumes silicon. Thus, gradually during the oxidation step, the surface of the silicon which forms the interface with the new layer of silicon recedes. The receding of the silicon surface has the advantage of causing the shallowest superficial cracks and other micro-apertures in the silicon to disappear, thus it is unnecessary to fill them.

BRIEF DESCRIPTION OF THE DRAWINGS

Other features and advantages of the present invention will appear more clearly from the following description of an example embodiment, given by way of non-limiting illustration, with reference to the annexed drawings, in which:

FIG. 1a shows the initial section of a silicon micromechanical part.

FIG. 2a corresponds to FIG. 1a after a layer of silicon dioxide has been formed.

FIG. 3a corresponds to FIG. 2a after removal of the silicon dioxide layer.

FIG. 1b is a significant enlargement of one part of FIG. 1a showing two micro-cracks and one micro-aperture in the silicon surface.

FIG. 2b corresponds to FIG. 1b after a layer of silicon dioxide has been formed.

FIG. 3b corresponds to FIG. 2b after the silicon dioxide layer has been removed.

DETAILED DESCRIPTION OF THE INVENTION

Examples of reinforced micromechanical parts that can be fabricated using the method of the invention may include toothed wheels, escape wheels, pallets or even other pivoting parts such as arbours. Finally, the method of the present invention also allows fabrication of passive parts, such as for example bearings.

FIG. 1a shows entirely schematically the section of a micromechanical part having a silicon core 1, where the reference 3 designates the initial external surface. When the silicon part is left for a certain period of time in the ambient medium, it is naturally coated with silicon dioxide, called "native oxide" (not shown), the thickness of which is substantially comprised between 1 and 10 nm. FIG. 1b is a significant enlargement of one part of FIG. 1a showing two micro-cracks 12 and one superficial micro-aperture 14 in the silicon surface 3. It is reasonable to assume that the presence of these cracks or micro-apertures might contribute to making the silicon part more fragile and brittle.

FIG. 2a shows the section of FIG. 1a after a layer of silicon oxide has been formed by thermal oxidation of the surface of the silicon part between 900° C. and 1200° C. The protocol disclosed in the work entitled "Semiconductor devices: physics and technology", (Ed. John Wiley & Sons, ISBN 0-471-87424-8, 01.01 1985, p. 341-355) is applied for this purpose. Thus, approximately 10 hours at a temperature of 1100° C. are required to obtain a $SiO_2$ thickness of around 1.9 μm. As FIG. 2a shows, the dioxide is formed to the detriment of the silicon, the front 3 of which recedes to create a new interface 5 with the $SiO_2$ that has formed. Conversely, given that the $SiO_2$ has a lower density, the external surface 7 of the $SiO_2$ extends beyond the initial surface of the part. The positions of these demarcation lines 3, 5 and 7 are not shown to scale. FIG. 2b shows the same enlargement as FIG. 1b after the silicon dioxide layer has been formed. It is seen that the superficial micro-aperture 14 has completely disappeared because the interface 5, between the silicon and the $SiO_2$ that has formed, has receded. It is also seen that the micro-cracks 12 have been completely filled by the silicon dioxide.

FIG. 3a shows the same section of the silicon part after the silicon dioxide layer has been removed by etching with a hydrofluoric acid solution. Once the layer of $SiO_2$ has been removed by the treatment, it is seen that the border 5, which in FIG. 2 matched the interface between the silicon and the oxide, has now become the external surface. Since the oxidation has consumed part of the silicon, the dimensions of the micromechanical part provided by the method of the invention are slightly smaller than the dimensions given thereto during micro-machining. However, it is clear that knowledge of the physical properties of Si and $SiO_2$ and of the features of the thermal treatment can be used to calculate the initial dimensions for cutting the part so as to obtain the desired dimensions at the end of the treatment. FIG. 3b shows the same enlargement as FIGS. 1b and 2b after the silicon dioxide layer 2 has been removed. It is seen that "veins" of silicon dioxide remain inside the micro-cracks 12. In order to reduce the erosion of the dioxide inside the micro-cracks to a minimum, the step of stripping the silicon dioxide should preferably be interrupted as soon as layer 2 has been removed. Knowledge of the chemical properties of $SiO_2$ and of the diluted hydrofluoric acid employed for stripping can be used to calculate the optimum exposure time so as to remove the $SiO_2$ layer and yet retain the veins of dioxide in cracks 12. As previously mentioned, a silicon atom has more affinity for an oxygen atom than for another silicon atom. In these conditions, filling the micro-cracks with a thread of silicon dioxide could be responsible for the good mechanical resistance observed with the parts produced by the method of the present invention.

Further, those skilled in the art will understand that the silicon surface recedes when the dioxide layer is formed due to thermal oxidation. By forming the dioxide layer by another method, for example from silane ($SiH_4$) or TEOS ($Si(OC_2H_5)_4$), it would theoretically be possible to implement the method of the present invention while preventing the shrinkage of the parts which has just been described.

It will also be clear that various alterations and/or improvements evident to those skilled in the art may be made to the implementation which forms the subject of this description without departing from the scope of the present invention defined by the annexed claims. In particular, the hydrofluoric acid solution is not the only means of removing the silicon dioxide layer. Those skilled in the art could use any means which appear suitable to achieve this operation; in particular BHF could be used.

Moreover, according to a variant of the method of the invention that is not shown, an additional step could be provided in which a coating made of a material chosen for its tribological properties is formed on the silicon surface after the $SiO_2$ has been removed. Those skilled in the art could choose any other material which appears suitable for this purpose. In particular, diamond like carbon (DLC) or carbon nanotubes could be used.

The invention claimed is:

1. A method of fabricating a reinforced silicon micromechanical part configured to be integrated in a timepiece mechanism, the method including, in order:
   micro-machining a timepiece-mechanism part, or a batch of timepiece mechanism parts in a silicon wafer;
   forming a silicon dioxide layer over the entire surface of the part, in one or plural operations, so as to obtain a thickness of silicon dioxide that is at least five times greater than the thickness of native silicon dioxide; and
   removing the silicon dioxide layer by etching, which includes removing the silicon dioxide layer except for veins of silicon dioxide that fill cracks in the timepiece-mechanism part.

2. The method according to claim 1, wherein the silicon dioxide layer is formed by thermal oxidation of the surface of the part at a temperature of between 900° C. and 1200° C.

3. The method according to claim 1, wherein, in the micro-machining, the part is micro-machined with greater dimensions than the desired final dimensions, and wherein the silicon dioxide layer is then formed by thermal oxidation of the surface of the part at a temperature of between 900° C. and 1200° C.

4. The method according to claim 1, wherein after the removing the silicon dioxide layer, further comprising forming, on the surface of the part, a coating of a material having superior tribological properties to those of crystalline silicon.

* * * * *